(12) United States Patent
Chen

(10) Patent No.: US 6,704,094 B2
(45) Date of Patent: Mar. 9, 2004

(54) CORRECTION OF LEVELING TILT INDUCED BY ASYMMETRICAL SEMICONDUCTOR PATTERNS

(75) Inventor: Chih-Wei Chen, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 165 days.

(21) Appl. No.: 10/013,413

(22) Filed: Dec. 11, 2001

(65) Prior Publication Data

US 2003/0107719 A1 Jun. 12, 2003

(51) Int. Cl.[7] .................. G03B 27/32; G03B 27/42; G03B 27/52; G03B 27/68
(52) U.S. Cl. .................. 355/55; 355/52; 355/53; 355/77
(58) Field of Search .................. 355/39, 40, 42, 355/53, 55, 77; 356/399, 400, 401; 250/548

(56) References Cited

U.S. PATENT DOCUMENTS

| | | | | |
|---|---|---|---|---|
| 5,117,255 A | * | 5/1992 | Shiraishi et al. | 355/53 |
| 5,602,399 A | * | 2/1997 | Mizutani | 250/548 |
| 5,734,462 A | * | 3/1998 | Sakai | 355/53 |
| 5,955,739 A | * | 9/1999 | Kawashima | 250/548 |
| 5,978,332 A | * | 11/1999 | Itakura et al. | 369/44.32 |
| 6,151,100 A | * | 11/2000 | Yamane et al. | 355/53 |
| 6,501,532 B2 | * | 12/2002 | Suzuki | 355/53 |
| 6,549,271 B2 | * | 4/2003 | Yasuda et al. | 355/55 |

* cited by examiner

Primary Examiner—Rodney Fuller
(74) Attorney, Agent, or Firm—Tung & Associates

(57) ABSTRACT

The correction of improper leveling tilt induced by a leveling sensor of a semiconductor equipment improperly detecting a semiconductor wafer having an asymmetrical semiconductor pattern as out of horizontal is disclosed. The improper leveling tilt is determined, and a corrective leveling tilt is applied to compensate for the improper leveling tilt induced by the leveling sensor. The improper leveling tilt can be determined as the experimentally determined difference in focus between dense features of the asymmetrical pattern divided by the experimentally determined distance between the dense features. The improper leveling tilt can also be modeled as the difference in height between dense features and isolated features of the asymmetrical pattern, times a predetermined parameter, and divided by the field-of-view length of the leveling sensor.

20 Claims, 8 Drawing Sheets

CORRECTION OF LEVELING TILT INDUCED BY ASYMMETRICAL SEMICONDUCTOR PATTERNS

FIELD OF THE INVENTION

This invention relates generally to semiconductor device fabrication, and more particularly to such fabrication where the devices have asymmetrical patterns.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, and less are becoming routine. Improvements have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength. Sub-wavelength lithography, however, places large burdens on lithographic processes. Resolution of anything smaller than a wavelength is generally quite difficult. Pattern fidelity can deteriorate dramatically in sub-wavelength lithography. The resulting semiconductor features may deviate significantly in size and shape from the ideal pattern drawn by the circuit designer.

One particular issue that impacts the quality of lithography is focus variation, which is nearly ubiquitous in IC manufacturing because of the combined effects of many problems, such as wafer non-flatness, auto-focus errors, leveling errors, lens heating, and so on. A useful lithographic process should be able to print acceptable patterns in the presence of some focus variation. Similarly, a useful lithographic process should be able to print acceptable patterns in the presence of variation in the exposure dose, or energy, of the light source being used. To account for these simultaneous variations of exposure dose and focus (or lack thereof), it is useful to map out the process window, such as an exposure-defocus (ED) window, within which acceptable lithographic quality occurs. The process window for a given feature shows the ranges of exposure dose and depth of focus (DOF) that permit acceptable lithographic quality.

For example, FIG. 1 shows a graph 100 of a typical ED process window for a given semiconductor pattern feature. The y-axis 102 indicates exposure dose of the light source being used, whereas the x-axis 104 indicates DOF. The line 106 maps exposure dose versus DOF at one end of the tolerance range for the critical dimension (CD) of the pattern feature, whereas the line 108 maps exposure dose versus DOF at the other end of the tolerance range for the CD of the feature. The area 110 enclosed by the lines 106 and 108 is the ED process window for the pattern feature, indicating the ranges of both DOF and exposure dose that permit acceptable lithographic quality of the feature. Any DOF-exposure dose pair that maps within the area 110 permits acceptable lithographic quality of the pattern feature. As indicated by the area 110, the process window is typically indicated as a rectangle, but this is not always the case, nor is it necessary.

To ensure that focus is properly maintained, some semiconductor equipment include leveling sensors. Such semiconductor equipment can include steppers and scanners. Steppers and scanners are types of semiconductor fabrication equipment used in photolithographic processing, such as aligning a mask over a wafer and exposing the pattern of the mask onto the wafer. A scanner typically uses a mirror system with a slit blocking part of the light coming from the light source. The size of the slit is smaller than the wafer, so the light beam scans across the wafer. Whereas scanning is generally performed on a per-wafer basis, a stepper is utilized on only a given part of the wafer at one time. A reticle is aligned and exposed, without scanning, and then is stepped to the next site and the process is repeated. Stepping generally allows more precise matching of larger-diameter wafers than scanners do.

Another type of semiconductor fabrication equipment combines the stepping and scanning process of steppers and scanners, and is known as step and scan aligners. At one position on the semiconductor wafer, a small-scale scanning process takes place, and then the reticle or mask is stepped to the next position, where the scanning process is repeated. As used herein, steppers, scanners, and step and scan aligners are generally encompassed under the term alignment and exposure equipment, which can include other types of specific semiconductor fabrication equipment besides steppers, scanners, and step and scan aligners. Examples of steppers, scanners, and step and scan aligners include those available from ASML Holding, N.V., of the Netherlands. Furthermore, unless otherwise and specifically noted, steppers, scanners, and step and scan aligners are used substantially interchangeably herein, such that reference to or description of one should be assumed to apply to other types of alignment and exposure equipment as well.

Leveling sensors of such steppers, scanners, and step and scan aligners ensure that the plane of the semiconductor wafer is horizontal. If the wafer is tilted, for instance, the semiconductor equipment will likely be out-of-focus for at least a part of the wafer, which can lead to improperly fabricated semiconductor devices, and thus to wafer scrap. Wafer scrap is costly. A leveling sensor detects the degree to which the semiconductor wafer is out of horizontal, and tilts the wafer so that it remains horizontal for the alignment and exposure processes, as well as potentially for other processes, to be performed by the semiconductor equipment. The leveling detection by such sensors is typically performed on a field-by-field basis. That is, when the semiconductor equipment moves such that it has a new field of view with respect to the wafer, the leveling sensor ensures thereafter that the wafer is still horizontally level, so that proper alignment and exposure can be performed.

A difficulty with at least some leveling sensors, however, is that they may incorrectly detect the semiconductor wafer as being non-horizontal, and correspondingly improperly tilt the wafer, when in fact the wafer is horizontal. This has been found to occur especially with semiconductor wafers on which asymmetrical semiconductor device patterns have been, or will be, fabricated. An asymmetrical semiconductor pattern is generally defined as one in which features of one part of the pattern are substantially dense, whereas features of another part of the pattern are substantially isolated. By comparison, a symmetrical semiconductor pattern is generally defined as one in which features of at least most parts of the pattern substantially have the same density, such that they are substantially dense, substantially isolated, substantially semi-dense, substantially semi-isolated, and so on. Density generally measures the periodicity of which the features appear in a given part of a pattern, where dense features have a low periodicity, and thus have a high frequency of appearance, and isolated features have a high periodicity, and thus have a low frequency of appearance.

Examples of asymmetrical patterns are shown in FIGS. 2A and 2B. In FIG. 2A, the pattern 202 has left-right asymmetry, where the left pattern part 204 has dense features, and the right pattern part 206 has isolated features. These isolated features can be lines, contacts, as well as other types of features. Similarly, in FIG. 2B, the pattern 212 has up-down asymmetry, where the upper pattern part 214 has dense features, and the lower pattern part 216 has isolated features. By comparison, examples of symmetrical patterns are shown in FIGS. 2C and 2D. In FIG. 2C, the pattern 222 has a pattern part 224 that is substantially isolated, whereas, in FIG. 2D, the pattern 232 has a pattern part 234 that is substantially dense.

The problem with untimely corrective tilting as a result of improper sensing by the leveling sensor is that the features of the semiconductor pattern can become out of focus. An example of the improper corrective tilting resulting from the leveling sensor is shown in FIG. 3. The semiconductor wafer originally was at horizontal, in the position indicated by the dotted line 302. However, because the wafer had an asymmetrical pattern, the leveling sensor improperly detected leveling tilt, and applied corrective tilting, resulting in the semiconductor wafer being tilted by an amount indicated by the line 304, such that the wafer is improperly in the position indicated by the solid line 306. This leveling tilt in itself causes improper focus.

The leveling tilt also can cause focal plane deviation. Focal plane deviation can be defined as the distance parallel to the optical axis from a point on the wafer surface, to the focal plane of the optical system of the semiconductor equipment, where the focal plane can be generally defined as the plane perpendicular to the optical axis of the system that includes a focal point. Stated another way, the focal plane deviation generally defines the maximum displacement from the front reference plane, and appears as a positive measurement for above the plane, and a negative one for below the plane. Focal plane deviation is thus related to the depth of field of scanners, steppers, and other types of semiconductor imaging equipment.

An example of focal plane deviation that can be caused by the improper tilting is shown in FIG. 4. The focal plane of the semiconductor wafer originally was flat, as indicated by the dotted box 402. After the improperly applied corrective leveling tilt, the focal plane becomes the focal plane 404, which reflects a pin-cushion effect in which the corners of the focal plane 404 are bent out of focus, as indicated by the lines 406, 408, 410, and 412. That is, the corners of the focal plane 404 have deviated from their correct positions, resulting in the semiconductor equipment being out of focus at the corners. This may cause a decreased depth of field for imaging the corresponding corners of the semiconductor wafer, which can result in improper semiconductor device fabrication.

Therefore, there is a need for correcting the improper leveling tilt resulting from the leveling sensor of at least some semiconductor equipment incorrectly detecting leveling tilt on semiconductor wafers having asymmetrical patterns. Such correction should desirably improve the focus of the semiconductor equipment, as may have been worsened as a result of the improper leveling tilt. Furthermore, such correction should desirably improve the focal plane deviation that can also result from improper leveling tilt due to incorrect leveling tilt detection by the leveling sensor. For these and other reasons, there is a need for the present invention.

SUMMARY OF THE INVENTION

The invention relates to correcting the improper leveling tilt induced by a leveling sensor of semiconductor equipment improperly detecting a semiconductor wafer having an asymmetrical semiconductor pattern as out of horizontal. The improper leveling tilt is determined, and a corrective leveling tilt is applied to compensate for the improper leveling tilt induced by the leveling sensor. The improper leveling tilt may be determined experimentally, and/or by modeling. In the former case, the improper leveling tilt can be determined as the experimentally determined difference in focus between dense features of the asymmetrical pattern divided by the experimentally determined distance between the dense features. In the latter case, the improper leveling tilt can be modeled as the difference in height between dense features and isolated features of the asymmetrical pattern, times a predetermined parameter, and divided by the field-of-view length of the leveling sensor.

The invention provides for advantages not found within the prior art. The invention determines and compensates for the improper leveling tilt induced by the leveling sensor. This results in an improvement of the focus of the semiconductor equipment of which the leveling sensor is a part, and also improves the focal plane deviation that can result from improper leveling tilt. The invention provides for both an experimental manner by which to determine the improper leveling tilt, as well as a theoretical manner in which the improper leveling tilt is modeled. Other advantages, embodiments, and aspects of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
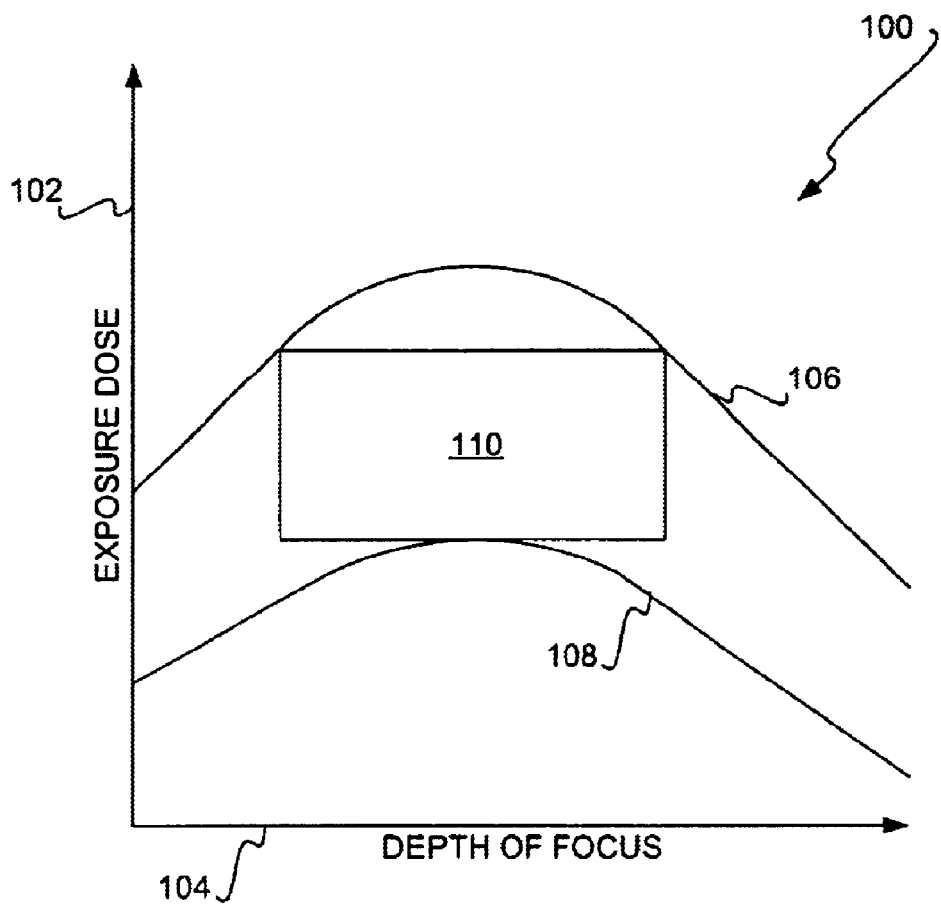
FIG. 1 is a diagram showing an example exposure-defocus (ED) process window for a given pattern feature showing the ranges of exposure dose and focus that permit acceptable lithographic quality.
Figure 2A:
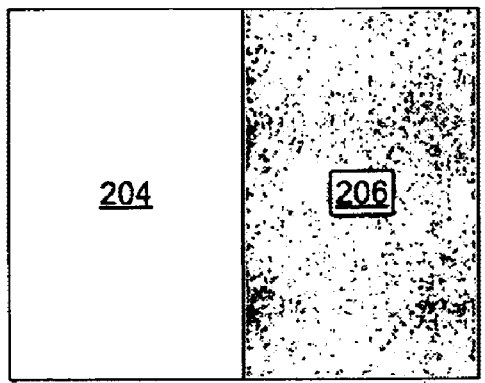
FIGS. 2A and 2B are diagrams showing example asymmetrical semiconductor patterns, where the pattern of FIG. 2A has left-right asymmetry, and the pattern of FIG. 2B has up-down asymmetry.
Figure 2A:
Figure 2B:
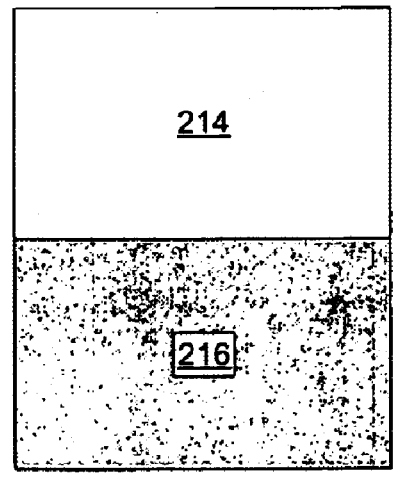
Figure 2B:
Figure 2C:
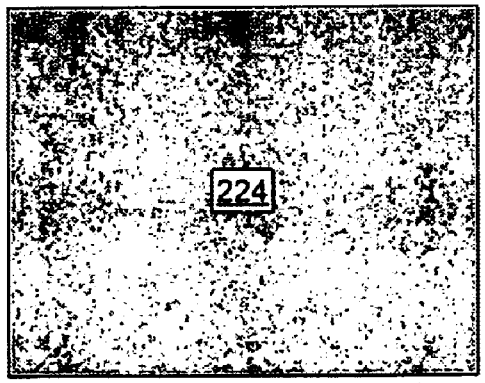
FIGS. 2C and 2D are diagrams showing example symmetrical semiconductor patterns, where the pattern of FIG. 2C substantially has isolated features only, and the pattern of FIG. 2D substantially has dense features only.
Figure 2C:
Figure 2D:
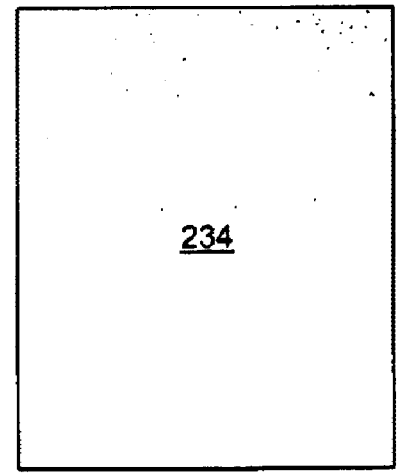
Figure 2D:
Figure 3:
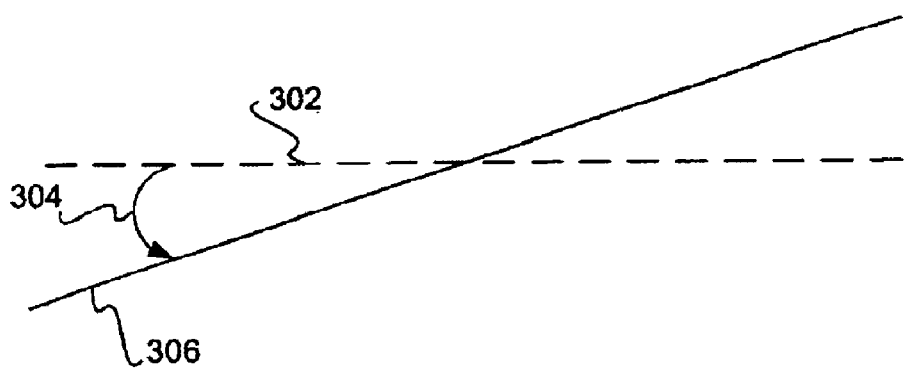
FIG. 3 is a diagram showing an example of the improper leveling tilt induced by a leveling sensor incorrectly detecting a semiconductor wafer having an asymmetrical semiconductor pattern as out of horizontal.
Figure 4:
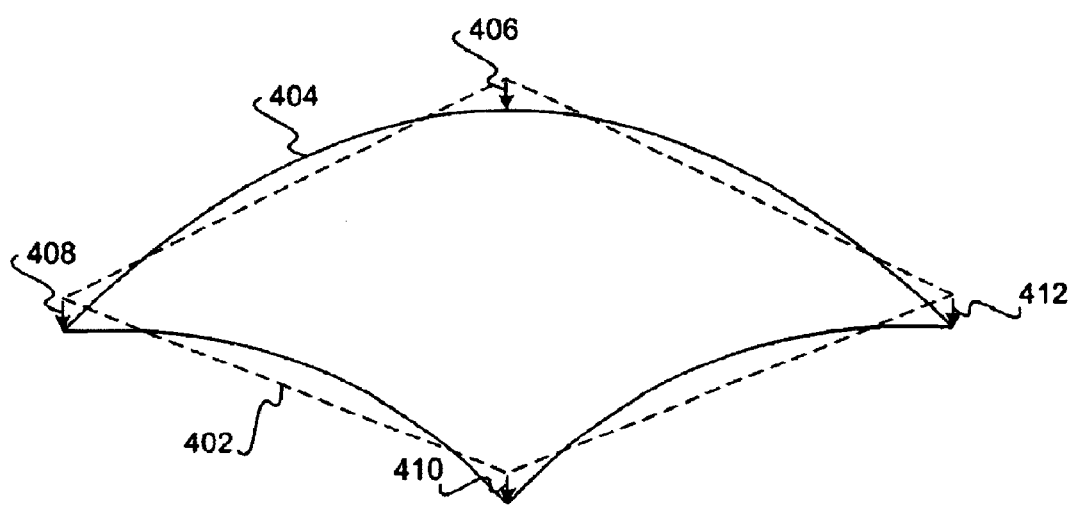
FIG. 4 is a diagram showing an example of the focal plane deviation of a semiconductor wafer having an asymmetrical semiconductor pattern resulting from improper leveling tilt induced by a leveling sensor incorrectly detecting the wafer as out of horizontal.
Figure 5:
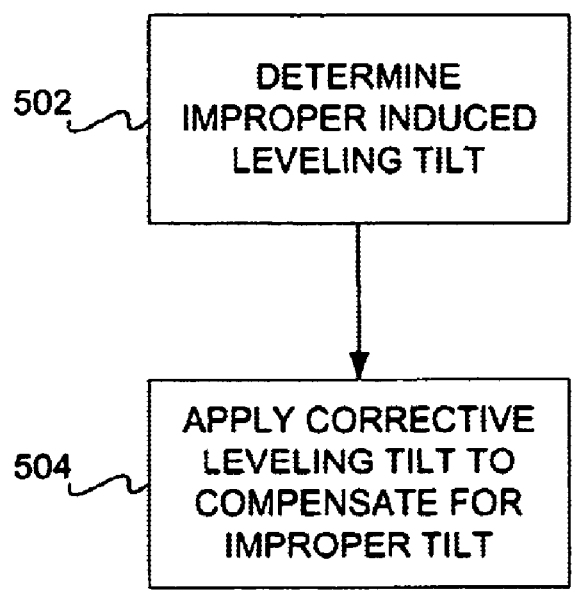
FIG. 5 is a flowchart of a method for compensating for improper leveling tilt induced by a leveling sensor incorrectly detecting a semiconductor wafer as out of horizontal, according to an embodiment of the invention.

FIG. 5 shows a method 500 for compensating for improper leveling tilt induced by a leveling sensor incorrectly detecting a semiconductor wafer as out of horizontal, according to an embodiment of the invention. The leveling sensor is part of semiconductor fabrication equipment, such as semiconductor lithographical equipment like a stepper, a scanner, a stepper and scanner, and so on. The semiconductor wafer preferably has an asymmetrical semiconductor pattern, with a number of dies thereon. First, the improperly induced leveling tilt is determined (502), and then a corrective leveling tilt is applied to compensate for the improper tilt (504), where the corrective leveling tilt has the same magnitude, but the opposite direction, to that of the improperly induced leveling tilt.

The determination of the improperly induced leveling tilt can be accomplished either experimentally, or theoretically by using a model. Where the asymmetry of the semiconductor pattern is left-right, the improper leveling tilt is up-down, and where the asymmetry of the pattern is up-down, the improper leveling tilt is left-right. That is, typically the improper leveling tilt has an orientation opposite of that of the asymmetry of the asymmetrical semiconductor pattern.

Figure 6:
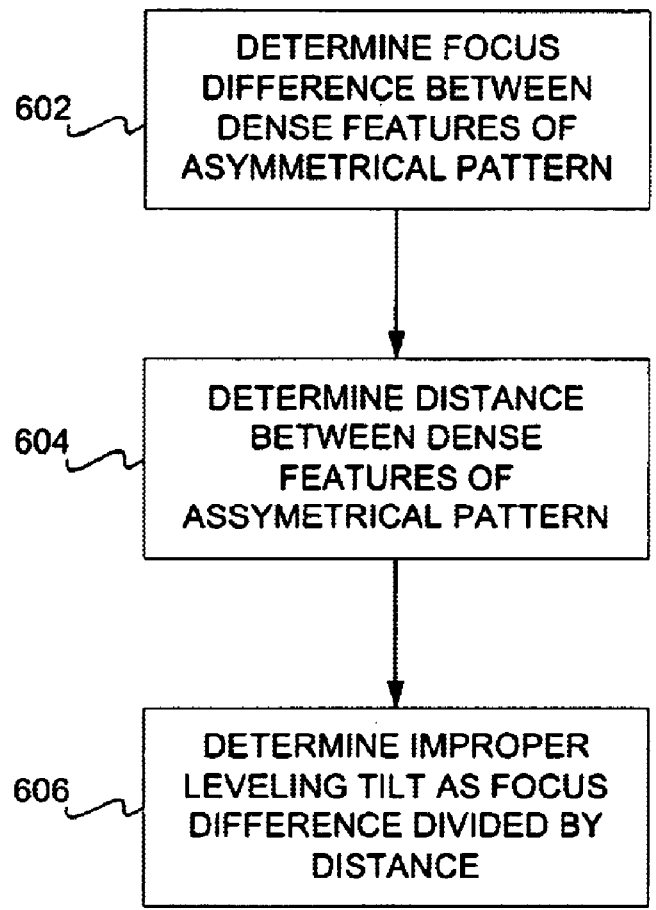
FIG. 6 is a flowchart of a method for determining the improper leveling tilt induced in an experimental manner, according to an embodiment of the invention.

FIG. 6 shows a method 600 for experimentally determining the improperly induced leveling tilt. First, the focus difference between dense features of an asymmetrical pattern is determined (602), and then the distance between the dense features of the pattern is determined (604). These determinations are preferably made by performing an energy-focus matrix experiment that results in a number of scanning-electron microscope (SEM) images, on which basis the determinations are then made. The images particularly are of at least the dense features of the asymmetrical pattern on the semiconductor wafer, within the field of view of the leveling sensor. Finally, the improper leveling tilt angle can be determined as the focus difference divided by the distance (606).

Figure 7:
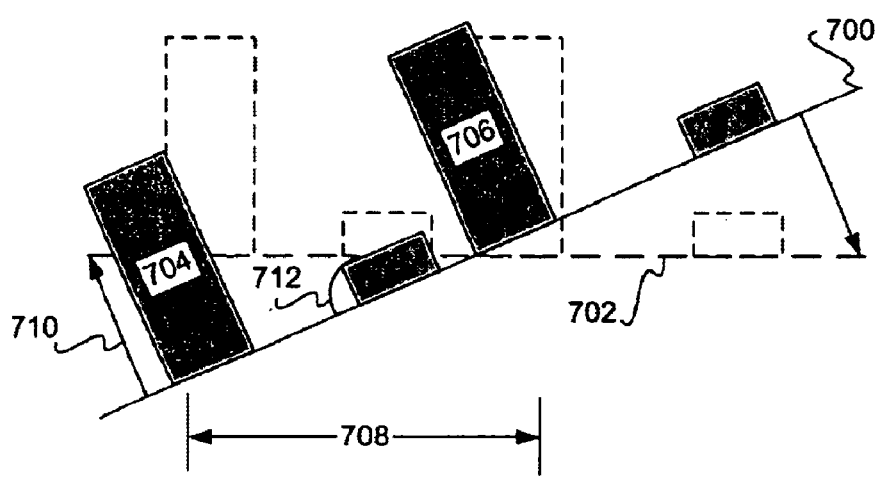
FIG. 7 is a diagram showing illustratively the determinations performed in the method of FIG. 6, according to an embodiment of the invention.

FIG. 7 illustratively shows the determinations of the method 600 of FIG. 6. The semiconductor wafer 700 is improperly tilted as shown, although it should be horizontally level, as indicated by the dotted lines, such as the dotted line 702. The wafer 700 has an asymmetrical pattern having dense features, including the referenced dense features 704 and 706. The focus difference determined in 602 of FIG. 6 is the focus difference 710, which is the distance from horizontal that the dense features are out of focus. The distance between dense features determined in 604 of FIG. 6 is the distance 708, which is the distance between two repeating dense features of the pattern of the wafer 700. Thus, the improper tilt 712 is the difference 710 divided by the distance 708.

The improper leveling tilt angle can also be determined theoretically by use of a model, where the improper tilt is equal to $s*H/X$, where s is a topography-dependent parameter, H is the height difference between dense and isolated features of the asymmetrical pattern on the semiconductor wafer, and X is the length of the field of view of the leveling sensor. The quantities H and X thus may be measured from the asymmetrical pattern on the semiconductor wafer, and then used in conjunction with the appropriate parameter s to obtain the angle of the improper leveling tilt. The parameter is predetermined, and is based on the number of dies within the semiconductor wafer. Generally, the parameter decreases as the number of dies increases. For instance, in one embodiment, where the number of dies is equal to 1, 2, 3, 4, 5, . . . , infinity, the parameter is equal to 1, 0.66, 0.33, 0.16, 0.08, . . . , 0, respectively.

The quantity H may also be dependent on the process being employed on the wafer, such as a chemical mechanical polishing (CMP) process, or a spin on glass (SOG) process. For example, the quantity H may be equal to $H(ILD)+n*H(IMD)$, where H(ILD) is the process-dependent step height for inter-layer dielectrics (ILD's), H(IMD) is the process-dependent step height for inter-metallic dielectrics (IMD's), and n is the number of dies or another value. H(ILD) is typically between 0.2 and 0.3 micron for an SOG process, and between 0.02 and 0.03 for a CMP process. H(IMD) is typically between 0.3 and 0.4 micron for an SOG process, and between 0.03 and 0.04 for a CMP process.

Figure 8:
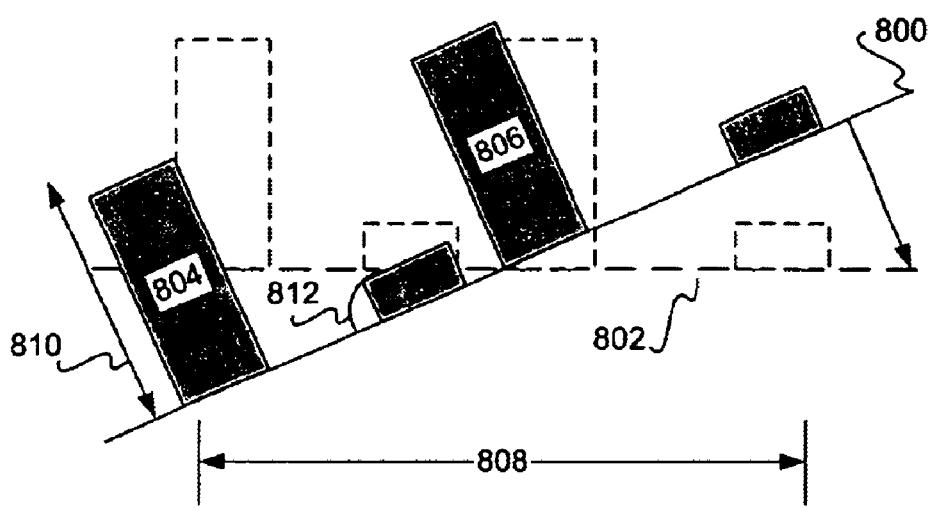
FIG. 8 is a diagram showing illustratively the determination of the improper leveling tilt induced in a theoretical manner, by using a model, according to an embodiment of the invention.

FIG. 8 illustratively shows determination of the improper leveling tilt by use of the model that has been described. The semiconductor wafer 800 is improperly tilted as shown, although it should be horizontally level, as indicated by the dotted lines, such as the dotted line 802. The wafer 800 has an asymmetrical pattern having dense features, including the referenced dense features 804 and 806. The quantity H needed in the model is the height difference 810 between dense and isolated features of the asymmetrical pattern of the wafer 800. Furthermore, the quantity X needed in the model is the length of the field of view of the leveling sensor, which is the length 808. Thus, the improper tilt 812 is the difference 810, times the appropriate predetermined parameter, and divided by the length 810.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. For instance, whereas the invention has been substantially described in relation to semiconductor features that are two-dimensional contacts, it may be applicable to other semiconductor features as well, such as one-dimensional lines and other features. Therefore, it is manifestly intended that this invention be limited only by the claims and equivalents thereof.

What is claimed is:

1. A method for correcting improper leveling tilt comprising:
   determining the improper leveling tilt induced by a leveling sensor of a semiconductor equipment improperly detecting a semiconductor wafer having an asymmetrical semiconductor pattern as out of horizontal; and
   applying a corrective leveling tilt to compensate for the improper leveling tilt induced by the leveling sensor.

2. The method of claim 1, wherein determining the improper leveling tilt induced by the leveling sensor comprises experimentally determining the improper leveling tilt.

3. The method of claim 2, wherein experimentally determining the improper leveling tilt comprises:

determining a difference in focus between dense features of the asymmetrical semiconductor pattern;

determining a distance between the dense features of the asymmetrical semiconductor pattern; and determining the improper leveling tilt as the difference in focus between the dense features divided by the distance between the dense features.

4. The method of claim 3, wherein determining the difference in focus between the dense features comprises:

performing an energy-focus matrix experiment resulting in images of at least features within a field of view of the leveling sensor; and determining the difference in focus based on the images.

5. The method of claim 4, wherein determining the distance between the dense features comprises determining the distance based on the images.

6. The method of claim 1, wherein determining the improper leveling tilt induced by the leveling sensor comprises modeling the improper leveling tilt.

7. The method of claim 6, wherein modeling the improper leveling tilt comprises modeling the improper leveling tilt as a difference in height between dense features and isolated features of the asymmetrical semiconductor pattern, times a predetermined parameter, and divided by a length of a field of view of the leveling sensor.

8. The method of claim 7, wherein the predetermined parameter is based on a number of dies within the semiconductor wafer.

9. The method of claim 8, wherein the predetermined parameter decreases as the number of dies within the semiconductor wafer increases.

10. The method of claim 1, wherein the asymmetrical semiconductor pattern has asymmetry having an orientation, and the improper leveling tilt has an orientation opposite of the orientation of the asymmetry of the asymmetrical semiconductor pattern.

11. The method of claim 1, wherein the asymmetrical semiconductor pattern has left-right asymmetry, and the improper leveling tilt is an up-down improper leveling tilt.

12. The method of claim 1, wherein the asymmetrical semiconductor pattern has up-down asymmetry, and the improper leveling tilt is a left-right improper leveling tilt.

13. A method for correcting improper leveling tilt induced by a leveling sensor of a semiconductor equipment improperly detecting a semiconductor wafer having an asymmetrical semiconductor pattern as out of horizontal, comprising:

determining a difference in focus between dense features of the asymmetrical semiconductor pattern;

determining a distance between the dense features of the asymmetrical semiconductor pattern;

determining the improper leveling tilt as the difference in focus between the dense features divided by the distance between the dense features; and applying a corrective leveling tilt to compensate for the improper leveling tilt induced by the leveling sensor.

14. The method of claim 13, wherein determining the difference in focus between the dense features comprises:

performing an energy-focus matrix experiment resulting in images of at least features within a field of view of the leveling sensor; and determining the difference in focus based on the images.

15. The method of claim 14, wherein determining the distance between the dense features comprises determining the distance based on the images.

16. The method of claim 13, wherein the asymmetrical semiconductor pattern has asymmetry having an orientation, and the improper leveling tilt has an orientation opposite of the orientation of the asymmetry of the asymmetrical semiconductor pattern.

17. A method for correcting improper leveling tilt induced by a leveling sensor of a semiconductor equipment improperly detecting a semiconductor wafer having an asymmetrical semiconductor pattern as out of horizontal, comprising:

modeling the improper leveling tilt as a difference in height between dense features and isolated features of the asymmetrical semiconductor pattern, times a predetermined parameter, and divided by a length of a field of view of the leveling sensor; and applying a corrective leveling tilt to compensate for the improper leveling tilt induced by the leveling sensor.

18. The method of claim 17, wherein the predetermined parameter is based on a number of dies within the semiconductor wafer.

19. The method of claim 18, wherein the predetermined parameter decreases as the number of dies within the semiconductor wafer increases.

20. The method of claim 17, wherein the asymmetrical semiconductor pattern has asymmetry having an orientation, and the improper leveling tilt has an orientation opposite of the orientation of the asymmetry of the asymmetrical semiconductor pattern.

* * * * *